(12) United States Patent
Gauthier, Jr. et al.

(10) Patent No.: US 12,107,083 B2
(45) Date of Patent: *Oct. 1, 2024

(54) FIN-BASED AND BIPOLAR ELECTROSTATIC DISCHARGE DEVICES

(71) Applicant: GLOBALFOUNDRIES U.S. Inc., Malta, NY (US)

(72) Inventors: Robert J. Gauthier, Jr., Williston, VT (US); Meng Miao, Williston, VT (US); Alain F. Loiseau, Williston, VT (US); Souvick Mitra, Essex Junction, VT (US); You Li, South Burlington, VT (US); Wei Liang, South Burlington, VT (US)

(73) Assignee: GLOBALFOUNDRIES U.S. Inc., Malta, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/462,779

(22) Filed: Sep. 7, 2023

(65) Prior Publication Data
US 2023/0420447 A1  Dec. 28, 2023

Related U.S. Application Data

(63) Continuation of application No. 17/185,243, filed on Feb. 25, 2021, now Pat. No. 11,804,481.

(51) Int. Cl.
| H01L 27/02 | (2006.01) |
| H01L 21/8222 | (2006.01) |
| H01L 21/84 | (2006.01) |
| H01L 27/12 | (2006.01) |

(52) U.S. Cl.
CPC ...... *H01L 27/0259* (2013.01); *H01L 21/8222* (2013.01); *H01L 21/84* (2013.01); *H01L 27/0288* (2013.01); *H01L 27/1207* (2013.01)

(58) Field of Classification Search
None
See application file for complete search history.

(56) References Cited

U.S. PATENT DOCUMENTS

| 7,323,752 | B2 | 1/2008 | Chu et al. |
| 7,397,089 | B2 | 7/2008 | Zhang et al. |
| 7,973,386 | B1 | 7/2011 | Vashchenko et al. |
| 8,648,421 | B2 | 2/2014 | Wen et al. |
| 9,214,540 | B2 | 12/2015 | Tsai et al. |
| 9,368,594 | B2 * | 6/2016 | Chang ................ H01L 29/0649 |
| 11,804,481 | B2 * | 10/2023 | Gauthier, Jr. ....... H01L 27/1207 |

(Continued)

OTHER PUBLICATIONS

Boschke et al., "ESD ballasting of Ge FinFET ggNMOS devices", IEEE International Reliability Physics Symposium (IRPS), 2017, 6 pages.

*Primary Examiner* — Bilkis Jahan
(74) *Attorney, Agent, or Firm* — Anthony Canale; Andrew M. Calderon; Calderon Safran & Wright P.C.

(57) ABSTRACT

The present disclosure relates to semiconductor structures and, more particularly, to electrostatic discharge (ESD) devices and methods of manufacture. The structure (ESD device) includes: a bipolar transistor comprising a collector region, an emitter region and a base region; and a lateral ballasting resistance comprising semiconductor material adjacent to the collector region.

18 Claims, 6 Drawing Sheets

(56) References Cited

U.S. PATENT DOCUMENTS

| | | | |
|---|---|---|---|
| 2008/0169513 A1* | 7/2008 | Denison | H01L 27/0259 |
| | | | 257/370 |
| 2015/0294968 A1 | 10/2015 | Yang et al. | |
| 2016/0111411 A1 | 4/2016 | Kalnitsky et al. | |
| 2017/0062564 A1* | 3/2017 | Zhou | H01L 21/76895 |
| 2017/0271322 A1 | 9/2017 | Russ et al. | |
| 2018/0076225 A1 | 3/2018 | Bergendahl et al. | |
| 2018/0082994 A1 | 3/2018 | Han et al. | |
| 2021/0249516 A1 | 8/2021 | Li et al. | |

* cited by examiner

FIN-BASED AND BIPOLAR ELECTROSTATIC DISCHARGE DEVICES

FIELD OF THE INVENTION

The present disclosure relates to semiconductor structures and, more particularly, to fin-based and bipolar electrostatic discharge (ESD) devices and methods of manufacture.

BACKGROUND

To protect semiconductor circuits, features are typically provided to protect against electrostatic discharge (ESD), which is a sudden transient flow of charge that can cause electrical shorts or dielectric breakdowns. In fact, ESD events can cause the failure of solid state electronic components on such integrated circuit chips. For example, ESD events can potentially lead to core circuits being damaged, resulting in gate oxide pin holes, junction damage, metal damage, and surface charge accumulation. Moreover, ESD events can induce latch-up, which can cause permanent damage to the circuit.

To prevent such problems, ESD devices can be integrated directly into integrated circuit (IC) chips. Such ESD devices can protect the circuit elements in the IC chips during manufacturing and/or operation of the circuits in the IC chips. For example, the ESD devices can be designed to be triggered, i.e., switched from an 'off' state to an 'on' state, when exposed to an ESD event. Under normal operation, the ESD devices are normally in their "off" state.

ESD devices can include many different types of devices. For example, an ESD device can include a lateral bipolar transistor using planar technologies. In this technology, a ballast resistance can be provided by silicide regions, as an example. Illustratively, the ballast resistance provided by the silicided regions (e.g., silicided block) provides an added resistance which, in turn, adds additional voltage to increase a voltage drop on the pad. So, if the ESD device is composed of many parallel fingers like is often the case, the increased voltage drop will help to trigger these parallel fingers into the ON state.

In FinFET technologies, there is no horizontal ballasting resistance, only vertical ballasting resistance. The ballast resistance designed into ESD devices where a large number of ESD parallel fingers are utilized, often referred to as a multi-finger triggering arrangement to handle a large transient current flow, not all of the protective ESD devices will turn ON after a small number of the ESD devices initially turn ON. In these cases, insufficient protection is provided due to not enough ballasting resistance in each parallel finger. This occurs when the amount of ballast resistance in the ESD device is insufficient to allow proper triggering to turn ON all of the multi-finger devices after one or a few of the devices are triggered.

SUMMARY

In an aspect of the disclosure, a structure comprises: a bipolar transistor comprising a collector region, an emitter region and a base region; and a lateral ballasting resistance comprising semiconductor material adjacent to the collector region.

In an aspect of the disclosure, a structure comprises: a fin-based bipolar electrostatic discharge (ESD) device comprising: a collector fin structure over a first well of a first dopant type, and ballasting resistance fin structures over a second well of a second dopant type and which contacts the collector fin structure, wherein the collector fin structure and the ballasting resistance fin structures are of the second dopant type.

In an aspect of the disclosure, a method comprising: forming a bipolar transistor comprising a collector region, an emitter region and a base region; and forming a lateral ballasting resistance comprising semiconductor material adjacent to the collector region.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

Figure 1A:
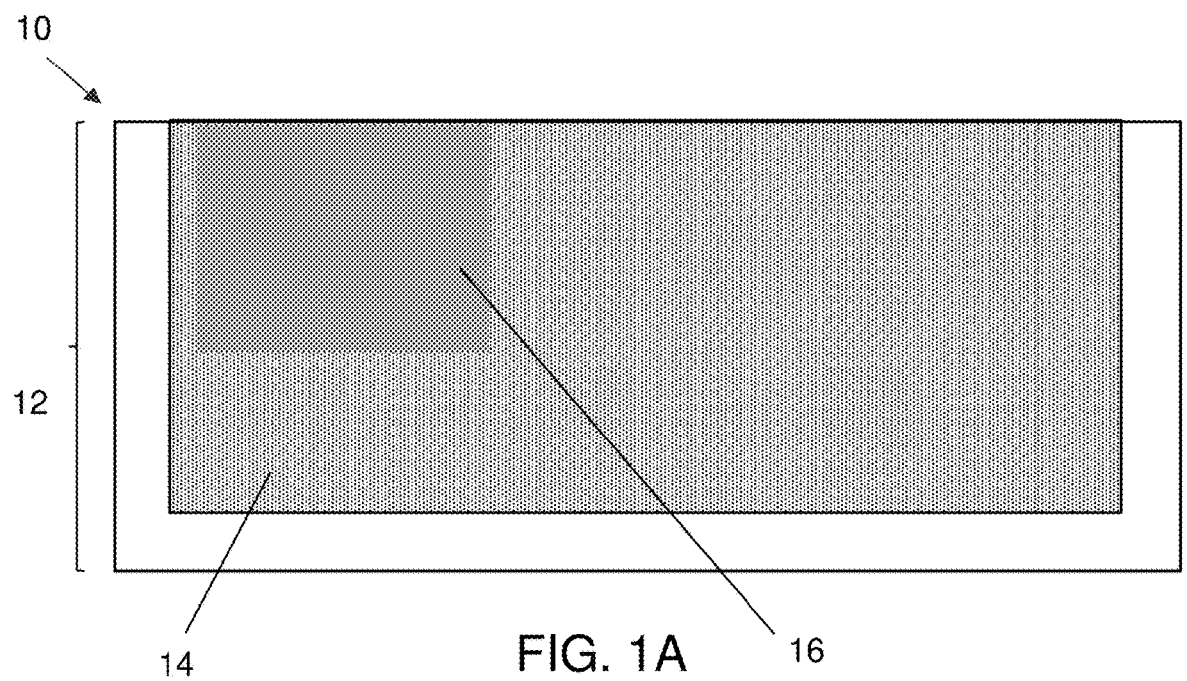
FIGS. 1A-1E show a fin-based bipolar electrostatic discharge (ESD) device and respective fabrication processes in accordance with aspects of the present disclosure.

The present disclosure relates to semiconductor structures and, more particularly, to fin-based and bipolar electrostatic discharge (ESD) devices and methods of manufacture. More specifically, the present disclosure relates to fin-based ESD bipolar devices and fully-depleted silicon-on-insulator (FD-SOI) or partially-depleted silicon-on-insulator (PDSOI) bipolar devices with lateral ballasting resistances. Advantageously, the present disclosure provides ESD performance improvement in FinFET, FDSOI and PDSOI technologies.

In embodiments, the ESD device can be a fin-based bipolar transistor with lateral ballasting resistance. The lateral ballasting resistance can be formed in the fin-based bipolar structures for ESD performance improvement in FinFET technologies. For example, in an implementation described in the present disclosure, a bipolar structure comprises N+ fins in an emitter region, a collector region and a ballast resistance region, and P+ fins in a base region. The collector, emitter and base regions can be formed in a P-well region; whereas, the ballast resistance region can be formed in a N-well region with multiple ballast resistance fins providing both vertical ballast resistance through the fins themselves and lateral ballast resistance. In particular, to increase the lateral ballast resistance, an epitaxially semiconductor layer can be provided to connect surfaces of the multiple ballast resistance fins and one or more adjacent collector fins to merge the ballast resistance fins and the collector fins.

In embodiments, a NPN transistor can be formed in FinFET technology using dummy merged ballast resistance fins to create ballasting resistance to enable multi-finger triggering. A lateral ballasted NPN transistor can be built in the FinFET technology where ballasting can be provided through epitaxially merged ballast resistance fins. Such a lateral bipolar device includes a plurality of fins adjacent to each other, where an innermost fin comprises a collector fin sitting in a P-well and adjacent fins comprise ballast resistance fins sitting in a N-well. In this structure, an epitaxial region over the ballast resistance fins can be silicided and contacted to serve as the collector contact by virtue of the epitaxial region extending over connecting fins between the collector fin and an outermost ballast resistance fin. Moreover, in this structure, the ballasting resistance can be adjusted by the number of ballasting fins with the silicide and contact regions located on the epitaxially merged ballasting fin regions. In further aspects, lateral ballast resistance can be provided by a fully depleted (FD) or partially depleted (PD) SOI structure.

In the FDSOI structure or PDSOI structure, for example, a lateral ballast resistance layer can be provided as a thin semiconductor layer over a buried oxide layer built with FDSOI technology adjacent to, and in contact with, one or both of the collector and emitter of a lateral bipolar transistor device formed in a bulk region of a substrate. In this way, a hybrid ESD device can be formed. For example, a lateral NPN bipolar transistor can be constructed using FDSOI or PDSOI technologies, where the ballasting resistance can be formed, e.g., by the thin semiconductor layer in a SOI region, and the NPN transistor can be in an adjacent bulk/hybrid region, where additional ballasting resistance enables the device to work with finger to finger scaling.

In further examples, a lateral ballasted NPN can be built in fully depleted SOI (FDSOI) or partially depleted SOI (PDSOI) technologies with the ballasting resistance on the SOI region and the core part of the NPN in an adjoining bulk region. Such a lateral bipolar device comprises an emitter and a collector formed in a bulk region on a wafer forming a core NPN transistor, where the emitter and collector ballasting resistances are provided on FDSOI/PDSOI regions adjacent to the NPN. In such arrangements, bulk NPN and FDSOI/PDSOI ballasting regions can be merged/integrated to form a ballasted NPN, where the ballasting can be integrated with bulk NPN transistor regions to provide ballasting within the collector and emitter silicon regions.

The ESD devices of the present disclosure can be manufactured in a number of ways using a number of different tools. In general, though, the methodologies and tools are used to form structures with dimensions in the micrometer and nanometer scale. The methodologies, i.e., technologies, employed to manufacture the ESD device of the present disclosure have been adopted from integrated circuit (IC) technology. For example, the structures are built on wafers and are realized in films of material patterned by photolithographic processes on the top of a wafer. In particular, the fabrication of the ESD device uses three basic building blocks: (i) deposition of thin films of material on a substrate, (ii) applying a patterned mask on top of the films by photolithographic imaging, and (iii) etching the films selectively to the mask.

FIG. 1A shows a beginning structure and respective fabrication processes in accordance with aspects of the present disclosure. More specifically, the structure 10 of FIG. 1A includes a substrate 12 composed of any suitable semiconductor material including, but not limited to, Si, SiGe, SiGeC, SiC, GE alloys, GaAs, InAs, InP, and other III/V or II/VI compound semiconductors. The substrate 12 may comprise any suitable crystallographic orientation (e.g., a (100), (110), (111), or (001) crystallographic orientation). The substrate 12 can be a single semiconducting material such as bulk silicon or composed of semiconductor on insulator (SOI) technologies.

Still referring to FIG. 1A, the substrate 12 includes wells 14, 16. In a lateral NPN bipolar application, the well 14 comprises a P-well and the well 16 comprises a N-well. In a lateral PNP bipolar application, the well 14 can be a N-well and the well 16 can be a P-well. The wells 14, 16 can be formed by introducing a different dopant type into the substrate 12 by, for example, ion implantation processes. For example, the P-well 14 can be doped with p-type dopants, e.g., Boron (B), and the N-well 16 can be doped with n-type dopants, e.g., Arsenic (As), Phosphorus (P) and Antimony (Sb), among other suitable examples.

In the ion implantation processes, respective patterned implantation masks may be used to define selected areas exposed for the implantations. The implantation mask used to select the exposed area for the well 14 is stripped after implantation, and before the implantation mask for the well 16 (or vice versa). Similarly, the implantation mask used to select the exposed area for well 16 is stripped after the implantation is performed. The implantation masks may include a layer of a light-sensitive material, such as an organic photoresist, applied by a spin coating process, pre-baked, exposed to light projected through a photomask, baked after exposure, and developed with a chemical developer. Each of the implantation masks has a thickness and stopping power sufficient to block masked areas against receiving a dose of the implanted ions. Solely for purposes of example, the N-well 14 and the P-well 16 can be doped at a $10^{-17}$ level.

Figure 1B:
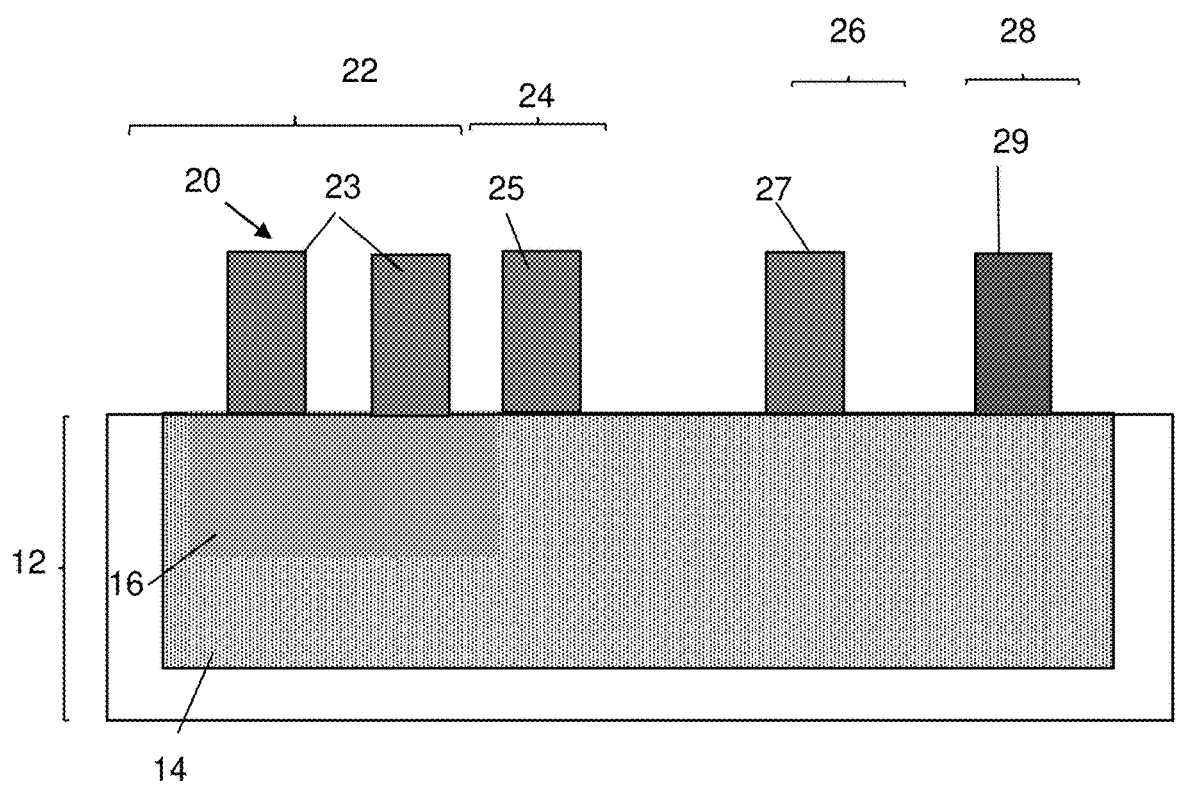

FIG. 1B shows a plurality of fin structures 20 formed from the substrate 12. The plurality of fin structures 20 can be formed prior to or after the formation of the wells 14, 16. In embodiments, the plurality of fin structures 20 can be formed by conventional lithography and etching processes including a sidewall image technique (SIT). In an example of a SIT technique, a mandrel material, e.g., $SiO_2$, is deposited on the substrate 12 using conventional chemical vapor deposition (CVD) processes. A resist is formed on the mandrel material, and exposed to light to form a pattern (openings). An etching process, e.g., reactive ion etching (RIE), can be performed through the openings to form the mandrels. Spacers are formed on the sidewalls of the mandrels which are preferably material that is different than the mandrels, and which can be formed using conventional deposition processes known to those of skill in the art. The mandrels are removed or stripped using a conventional etching process, selective to the spacers. An etching can then be performed within the spacing of the spacers to form the sub-lithographic features, e.g., fin structures 20. The sidewall spacers can then be stripped. In embodiments, the height of the fin structures can be between 20-50 nm, although these values are only for purposes of example and are not intended to limit the disclosure.

In embodiments, the fin structures 20 can be used in different regions of the structure which will form an ESD device. For example, as shown in FIG. 1B, the different regions include a ballast resistance region 22 having ballast resistance fins 23 (e.g., dummy fins) over the N-well 16, an emitter region 26 having one or more emitter fins 27, a base region 28 having one or more base fins 29 over the P-well 14, and a collector region 24 having one of more collector fins 25 over the P-well 14. Moreover, in the NPN application, the ballast resistance fin structures 23 in the ballast resistance region 22, the collector fin 25 and the emitter fin 27 can be n-doped fin structures; whereas, the base fin 29 can be a p-doped fin structure. In any scenario, the fin structures 20 can be doped by undergoing a shallow ion implantation process, preferably after the fin formation process and, preferably, after the deep ion implantation processes to form the wells 14, 16 using different masking steps as described above. In embodiments, the fin structures 20 can be doped at a level of about $10^{-20}$.

Figure 1C:
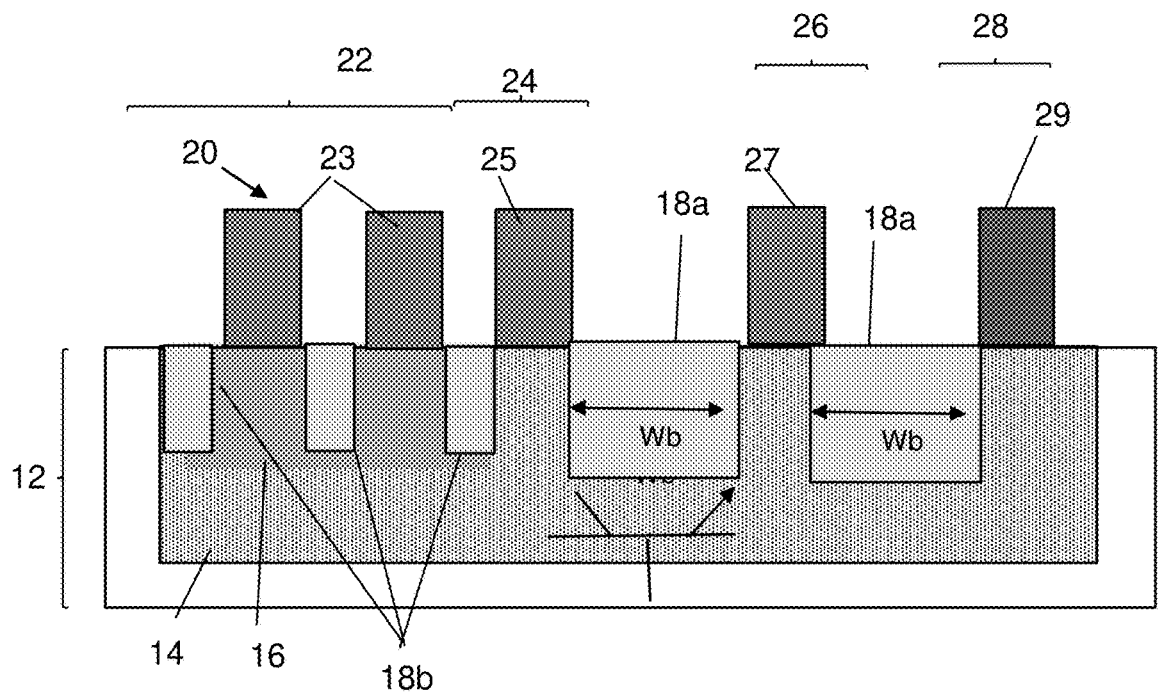

Referring to FIG. 1C, a plurality of shallow trench isolation structures 18a, 18b can be formed in the substrate 12, separating the fins 23, 25, 27, 29. In embodiments, the shallow trench isolation structures 18a extend into the well 14 between (i) the collector region 24 and the emitter region 26 to provide the base width Wb between the collector fin 25 and the emitter fin 27 and (ii) the emitter fin 27 and the base fin 29 to provide width Wb as described in more detail with respect to FIG. 1D; whereas, the shallow trench isolation structures 18b extend into the well 16 in the ballast resistance region 22 between the ballast resistance fins 23 themselves and between the ballast resistance fins 23 and the collector fin 25.

The shallow trench isolation structures 18a, 18b shown in FIG. 1C can be formed by conventional etching and deposition methods known to those of skill in the art. For example, an etching process with a selective chemistry, e.g., RIE, will be used to form one or more trenches in the substrate 12. Following the etching process, insulator material can be deposited by any conventional deposition processes, e.g., CVD processes, to form the shallow trench isolation structures 18a, 18b and 18c.

Figure 1D:
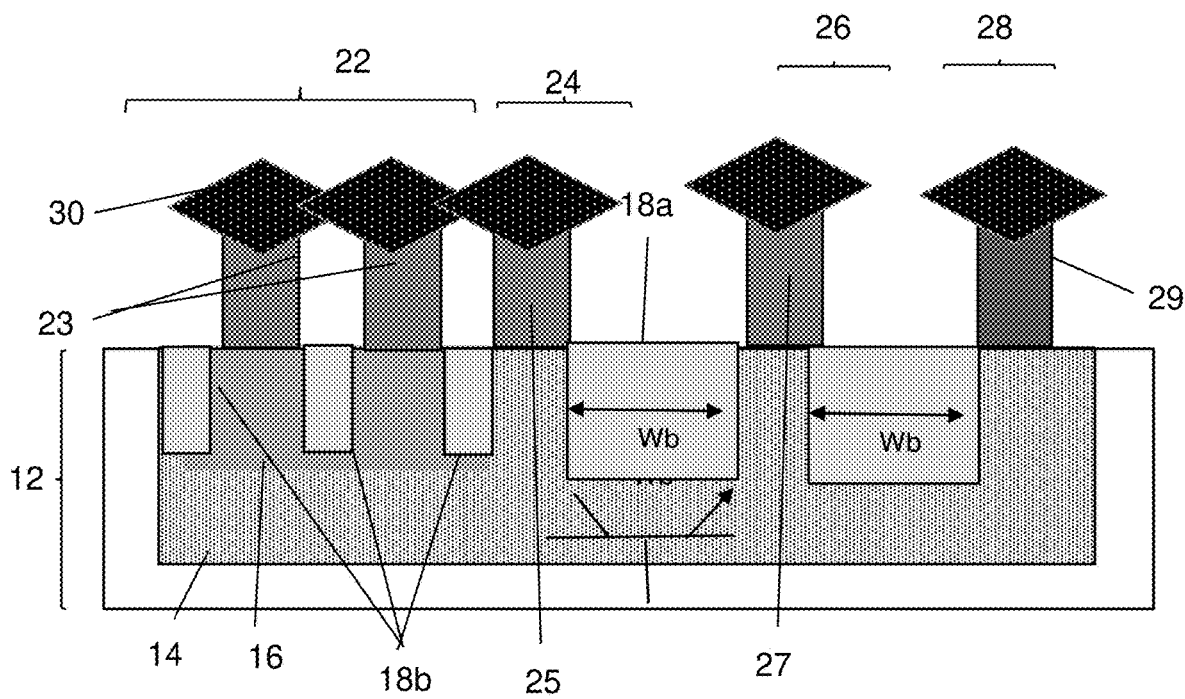

Referring to FIG. 1D, in embodiments, the fins 23, 25 can be shorted together with an epitaxial semiconductor layer 30 to increase the lateral ballast resistance of the collector fin 25. As described in more detail herein, the growth of the epitaxial semiconductor layer 30 will merge over the fins 23, 25, resulting in a short of the fins 23, 25 due to the minimal spacing between the fins 23, 25. In this way, a lateral ballast resistance is achieved by the epitaxial semiconductor layer 30 formed in direct contact with and merging together the ballast resistance fins 23 and the collector fin 25. In contrast, the epitaxial semiconductor layer 30 will not merge together between fins 25, 27 and 29 due to the increased distance Wb. In embodiments, an upper portion of the fins 23, 25 may be recessed before the growth of the epitaxial semiconductor layer 30 occurs.

More specifically, the epitaxial layer 30 can be formed by an epitaxial growth process using the upper surfaces of the ballast resistance fins 23 and the collector fin 25, and continuing until the individual epitaxial regions on each of the fins 23, 25 merge together and, hence, become shorted by the merged epitaxial semiconductor layer 30. The epitaxial semiconductor layer 30 can be any semiconductor material, and can be doped with the same dopant type as the ballast resistance fins 23 and the collector fin 25. By way of example, the epitaxial semiconductor layer 30 can be silicon germanium or silicon doped with phosphorous on a surface of each fins 23, 25, 27, 29. In accordance with alternative embodiments, the epitaxial layer 30 can be III-V compound semiconductor materials such as GaAs, InP, GaN, InGaAs, GaSb, AlSb, AlAs, AlP, GaP, combinations thereof or multilayers thereof.

In embodiments, the width Wb can be adjusted to ensure that epitaxial material 30 does not merge fins 25, 27 or fins 27, 29. By way of example, in embodiments, the base width Wb can be greater than the distance between the collector fin 25 and the closest adjacent ballast resistance fin 23. The base width Wb can also be greater than the distance between the ballast resistance fins 23 themselves. This ensures that the epitaxial growth that occurs on the upper surfaces of the collector fin 25 does not extend to and merge with the adjacent emitter fin 27 or base fin 29, which would short out the collector and emitter regions 24, 26 or short out the emitter region 26 and the base region 28.

For example, if the fin spacing between the individual ballast resistance fins 23 and between the collector fin 25 and the closest adjacent ballast resistance fin 23 is 14 nm (e.g., in 14 nm technology), then Wb can be set in a range between 15 nm to 100 nm. In preferred embodiments, Wb can be at least three (3) to four (4) times greater than the distance between the ballast resistance fins 23 and the collector fin 25 and the closest adjacent ballast resistance fin 23 to ensure that the epitaxial layer 30 does not short the collector fin 25 and emitter fin 27. Also, the height of the epitaxial layer 30 can be determined by the time required for the epitaxial growth process to merge the individual epitaxial regions on each of the ballast resistance fins 23 and the collector fin 25 to form the ballast resistance of epitaxial layer 30. Typically, in 14 nm technology, the height of the epitaxial layer 30 can be about 25 nm, although this is not intended to be limiting to the disclosure. In other technologies, such as 7 nm technology, the fin spacing, the base width Wb, and the height of the ballast resistance epitaxial layer 30 could be scaled accordingly.

Still referring to FIG. 1D, the P-well 14 in the collector region 24 and the N-well 16 in the ballast resistance region 22 can be in contact with one another. Alternatively, in the PNP application in which the well 16 can be a P-well and the well 14 can be a N-well, the ballast resistance fins 23, the collector fin 25 and the emitter fin 27 can be p-doped fin structures; whereas, the base fin 29 in the base region 28 can be a n-doped fin structure. As further shown in FIG. 1D, the ballast resistance fins 23, one base fin 29, one collector fin 25 and one emitter fin 27 are provided; however, it should be understood that a different number of fin structures can be used in each region.

As should be understood by those of skill in the art, the ballast resistance fins 23 in the ballast resistance region 22 in combination with the well 16 of a different implant dopant type, e.g., N-well, can form a lateral ballasting resistance at the ballast resistance region 22, e.g., a lateral N-well resistance and vertical dummy fin resistance in the ballast resistance fins 23. The lateral ballasting resistance provides stability to the circuit by preventing overcurrent faults. The lateral ballasting resistance can also be formed without a silicided block region. In this arrangement, the N-well 16 prevents the ballast resistance fins 23 from acting as collector fins by preventing an undesirable avalanche breakdown with the ballast resistance fins 23 thereby turning the ballast resistance fins 23 into dummy fins.

Figure 1E:
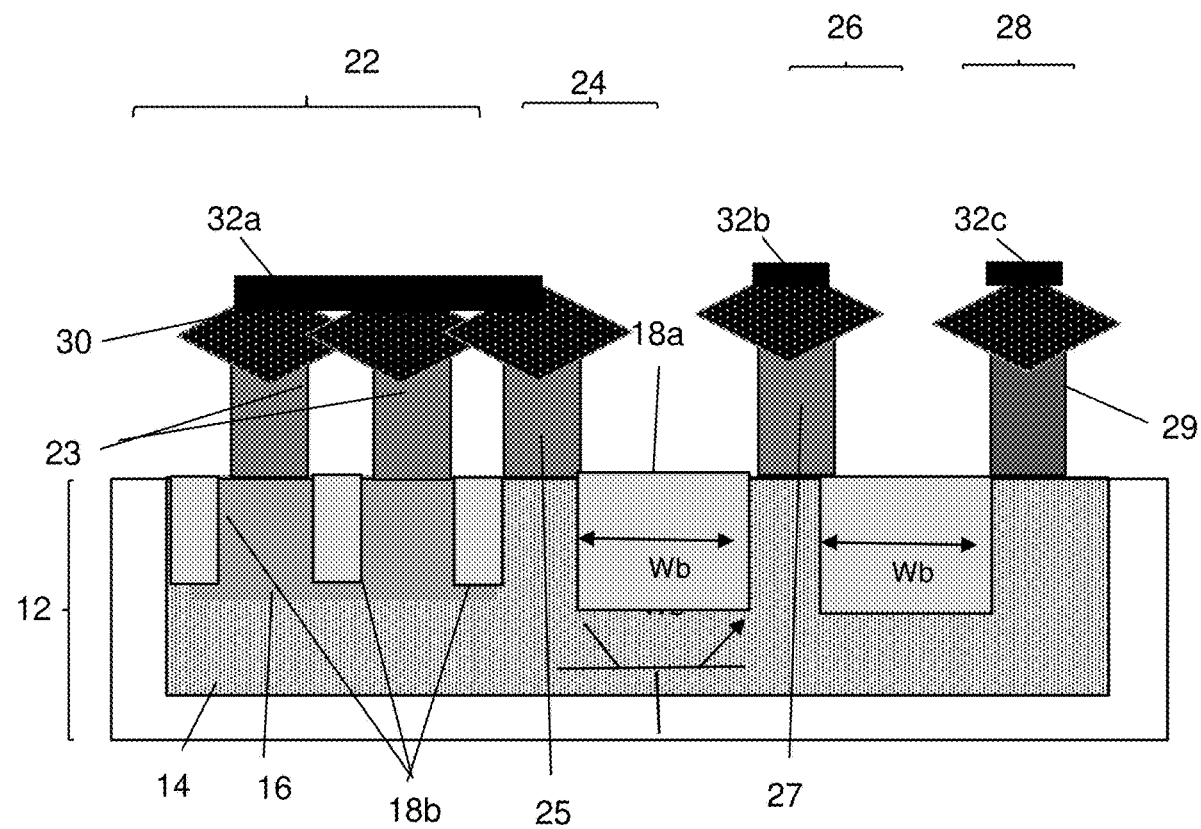

Referring to FIG. 1E, contacts 32a, 32b and 32c are provided, respectively, on the epitaxial semiconductor layer 30, the emitter fin 27 and the base fin 29. Since the epitaxial semiconductor layer 30 connects the upper surfaces of the ballast resistance fins 23 and the collector fin 25, the metal contact 32a also serves as a contact for the collector region 24.

The contacts 32a, 32b and 32c can be formed using a silicide process. As should be understood by those of skill in the art, the silicide process begins with deposition of a thin transition metal layer, e.g., nickel, cobalt or titanium, over fully formed and patterned semiconductor devices (e.g., doped or ion implanted ballast resistance epitaxial layer 30, the emitter fin 27 and the base fin 29 in the ESD device shown in FIG. 1E. After deposition of the material, the structure is heated allowing the transition metal to react with exposed silicon (or other semiconductor material as described herein) in the epitaxial semiconductor layer 30, the emitter fin 27 and the base fin 29, forming a low-resistance transition metal silicide. Following the reaction, any remaining transition metal is removed by chemical etching, leaving silicide contacts 32a, 32b and 32c in the ballast resistance epitaxial layer 30, the emitter fin 27 and the base fin 29 in the ESD device shown in FIG. 1E. Although not shown, metal contacts can be formed to the silicided regions using conventional CMOS processes known to those of ordinary skill in the art such that no further explanation is required herein for a complete understanding of the present disclosure.

Figure 2A:
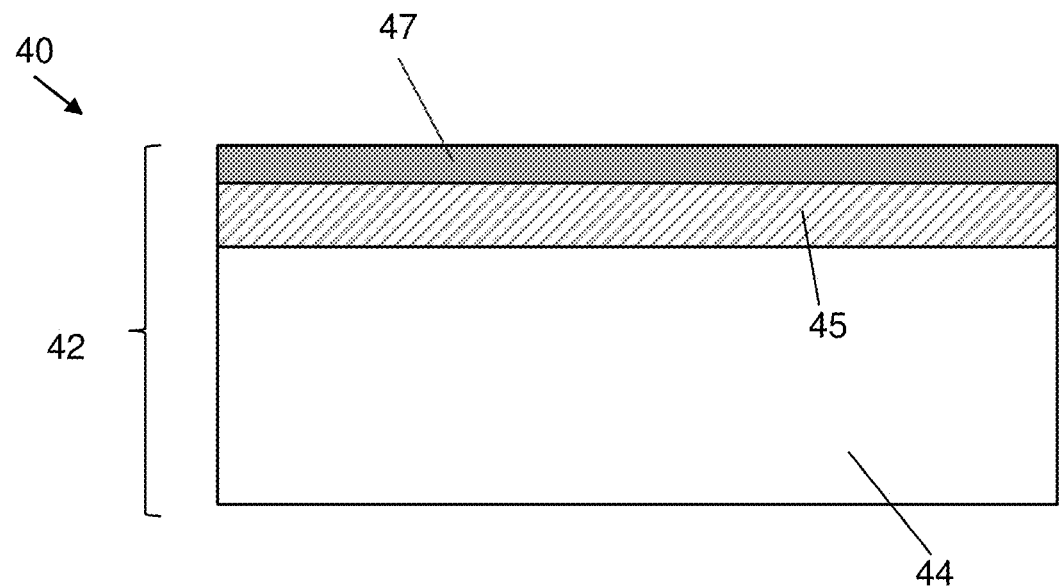
FIGS. 2A-2D show a fully-depleted (or partially depleted) silicon-on-insulator with bulk CMOS regions (hybrid SOI) bipolar electrostatic discharge (ESD) device and respective fabrication processes in accordance with aspects of the present disclosure.

FIG. 2A shows a beginning structure of an ESD device and respective fabrication processes using semiconductor on insulator (SOI) substrate technologies. More specifically, the ESD device 40 of FIG. 2A includes a substrate 42 composed of a silicon layer 44 or any other suitable semiconductor material including, but not limited to, SiGe, SiGeC, SiC, GE alloys, GaAs, InAs, InP, and other BIN or II/VI compound semiconductors. The substrate 42 may comprise any suitable crystallographic orientation (e.g., a (100), (110), (111), or (001) crystallographic orientation). An insulator layer 45 is provided over the semiconductor layer 44 and a semiconductor layer 47 is provided on the insulator layer 45. The semiconductor layer 47 can be partially or fully depleted SOI technologies. The insulator layer 45 comprises any suitable material, including silicon oxide, sapphire, other suitable insulating materials, and/or combinations thereof. An exemplary insulator layer 45 may be a buried oxide layer (BOX). The insulator 45 can be formed by any suitable process, such as separation by implantation of oxygen (SIMOX), oxidation, deposition, and/or other suitable process.

In a lateral NPN bipolar application, the semiconductor layer 44 can include a P-well. In a lateral PNP bipolar application, the semiconductor layer 44 can include a N-well. The semiconductor layer 44 can be formed by introducing a different dopant type into the semiconductor layer 44 by, for example, an ion implantation processes as already described herein.

Figure 2B:
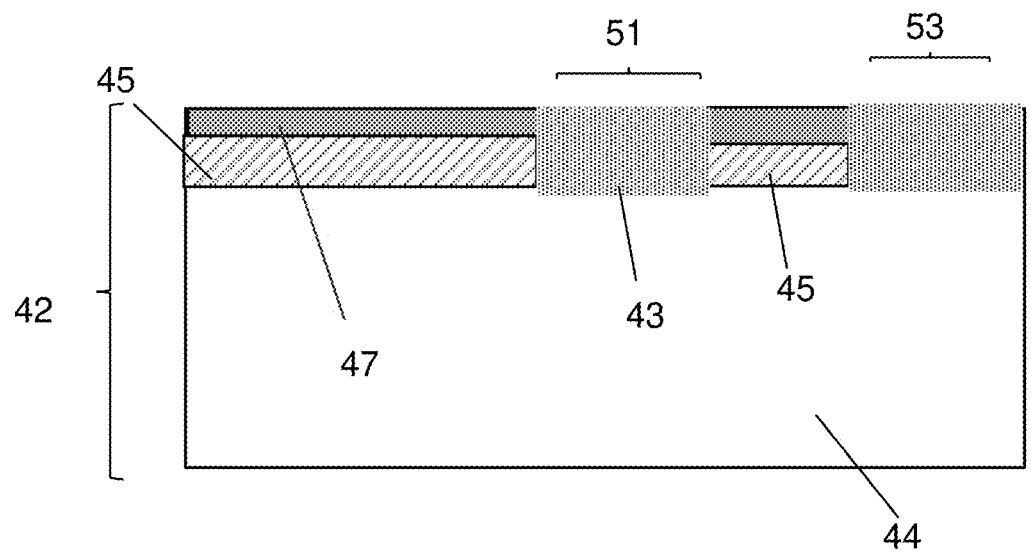

Referring to FIG. 2B, the insulator layer 45 and semiconductor layer 47 can be removed in an emitter region 51 and a base region 53. The insulator layer 45 and semiconductor layer 47 can be removed by conventional lithography and etching processes, e.g., RIE, as is known in the art such that no further explanation is required for a complete understanding of the present disclosure. In embodiments, the etching process will expose the underlying semiconductor layer 44 such that an epitaxial semiconductor material 43 can be grown in the emitter region 51 and base region 53 using conventional epitaxial growth process. In embodiments, the epitaxial semiconductor material 43 can be representative of a bulk region of a substrate composed of any suitable material including, but not limited to, Si, SiGe, SiGeC, SiC, GaAs, InAs, InP, and other III/V or II/VI compound semiconductors. Also, the epitaxial semiconductor material 43 can be planarized to form a planar surface using, e.g., a chemical mechanical planarization (CMP) process as is known in the art.

Figure 2C:
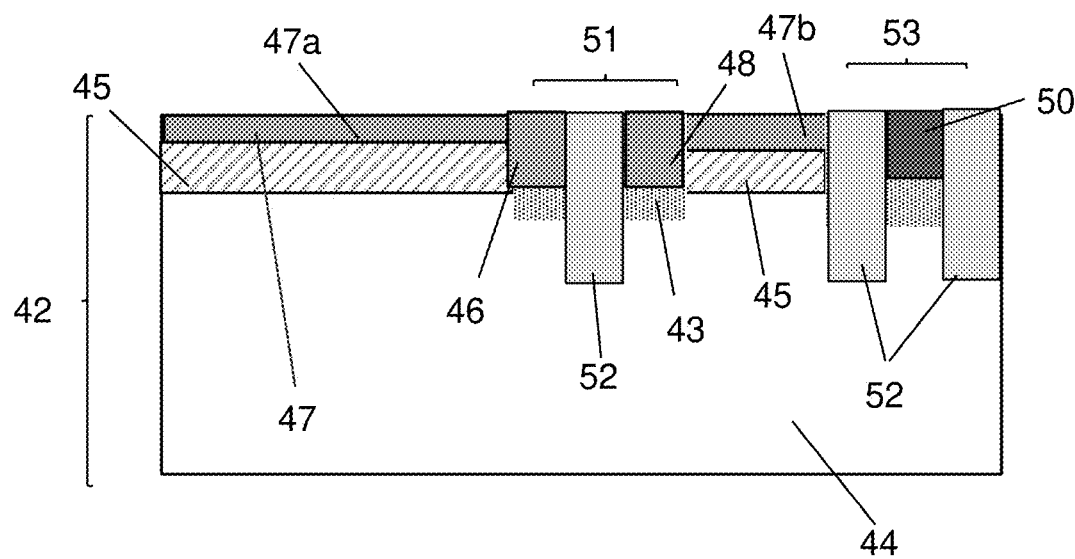

As shown in FIG. 2C, a plurality of shallow trench isolation structures 52 are formed in the emitter region 51 and base region 53, extending into the epitaxial semiconductor material 43. In embodiments, the shallow trench isolation structures 52 are formed using conventional lithography, etching and deposition processes as already described herein. Thereafter, a collector 46, an emitter 48 and a base 50 are formed in the epitaxial semiconductor material 43 to form a lateral bipolar transistor adjacent to FDSOI technology composed of a collector-side ballast resistance 47a and emitter-side ballast resistance 47b formed from the semiconductor layer 47. In this way, a hybrid device is formed with a lateral bipolar transistor structure in the semiconductor layer 44 and a ballast resistance structure formed with FDSOI technology adjacent to the lateral bipolar transistor structure.

In embodiments, the collector 46, emitter 48 and base 50 can be formed by conventional diffusion or ion implantation processes as already described herein. Alternatively, the regions 46, 48 and 50 could be formed by a doped epitaxial deposition for the epitaxial semiconductor material 43. In a lateral NPN bipolar application, the emitter 46 and collector 48 can be N+ regions, and the base 50 can be a P+ region. In a lateral PNP bipolar application, the emitter 46 and collector 48 can be P+ regions, and the base 50 can be a N+ region.

As shown in FIG. 2C, the collector-side ballast resistance 47a can be in contact with a side surface of the collector 46, and the emitter-side ballast resistance 47b can be in contact with a side surface of the emitter 48. Also, in NPN lateral bipolar transistor embodiments, both the collector-side ballast resistance 47a and the emitter-side ballast resistance 47b can be N+ doped diffusion regions which can be defined by an epitaxial growth. In PNP lateral bipolar transistor embodiments, both the collector-side ballast resistance 47a and the emitter-side ballast resistance 47b can be P+ doped diffusion regions which can be defined by an epitaxial growth.

By virtue of using a thin semiconductor layer 47 in the FDSOI/PDSOI technology, e.g., between 3 nm to 15 nm, the collector ballast resistance 47a and the emitter ballast resistance 47b can be of high resistance, for example 350 ohms, without the need for doping the semiconductor layer 47. Also, in embodiments, the semiconductor layer 47 could be doped to provide control of the amount of ballast resistance based on the amount of doping.

Figure 2D:
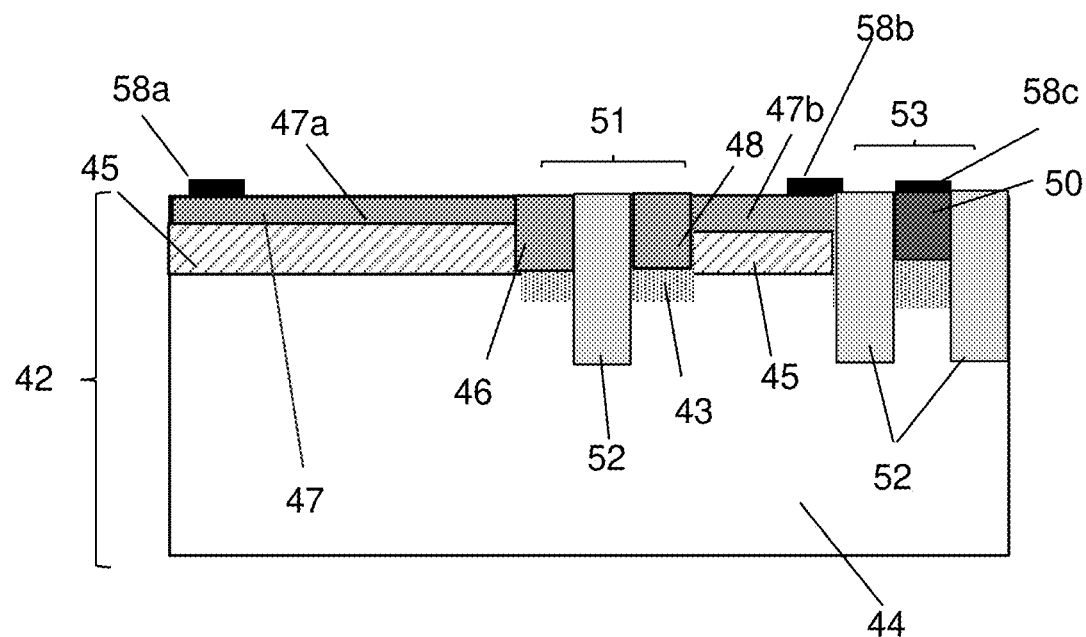

Referring to FIG. 2D, the ESD device 40 also includes contacts 58a, 58b and 58c, respectively formed on the collector-side ballast resistance 47a, the emitter-side ballast resistance 47b and the base region 50. These contacts 58a, 58b and 58c are formed in a manner similar to that described above for FIG. 1E, with regard to the contacts 32a, 32b and 32c, such that no further explanation is required herein.

By virtue of utilizing the lateral ballast resistance arrangements discussed with regard to FIGS. 1E and 2D, it is possible to substantially increase the ballast resistance in comparison with known ESD devices. For example, in a lateral NPN bipolar ESD device using FinFet technology in which the ballast resistance is only the vertical resistance in the fins themselves, under conditions of a threshold voltage of 8.75 volts and a holding voltage of 5.0 volts, a typical ballast resistance is 100 ohms. This is often insufficient to allow for triggering of all of the devices in a multi-finger ESD device arrangement, using, for example, several hundred individual ESD devices. In comparison, simulations using the arrangement shown in FIG. 1E, with similar threshold and holding voltages, the ballast resistance for each ESD device was 350 ohms. Similarly, in the arrangement shown in FIG. 2D with a lateral collector-side ballast resistance 47a and a lateral emitter-side ballast resistance 47b, and with similar threshold and holding voltages, the ballast resistance for each ESD device was 300 ohms.

In each instance, this increase in ballast resistance using the added lateral ballast resistance shown in the arrangements of FIGS. 1E and 2D is sufficient to ensure that all of the ESD devices in a multi-finger ESD arrangements will be triggered, as discussed below with regard to FIG. 3. It should be understood that these resistance values are exemplary, and that such resistance values can be increased or decreased based on different variables, e.g., types of materials, and doping profiles.

Figure 3:
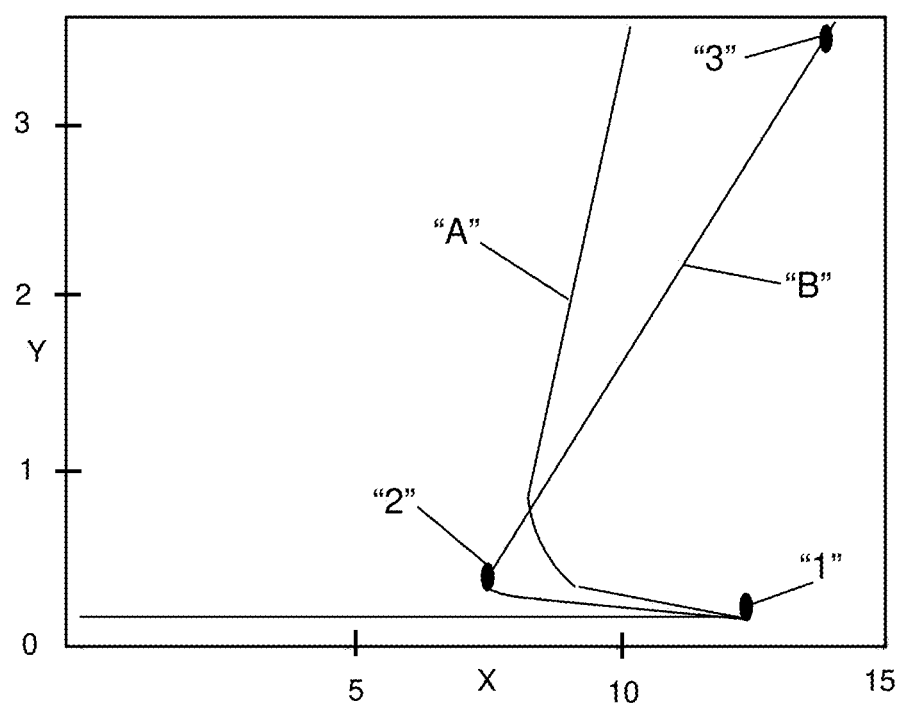
FIG. 3 shows a graph comparing ESD devices of the present disclosure with an ESD FinFET device that does not have a lateral ballasting resistance.

FIG. 3 shows a graph comparing ESD devices of the present disclosure with an ESD FinFET device that does not have lateral ballasting resistance as discussed with regard to FIGS. 1E and 2D. In the graph of FIG. 3, the ESD devices described in the present disclosure are depicted as line "B" and the ESD FinFET device that does not have lateral ballasting resistance is depicted as line "A". The x-axis is representative of voltage and the y-axis is representative of current. As shown in the comparison graph, line "A" and line "B" behave similarly, in that line "A" has a similar triggering voltage to line "B" at point "1" prior to a snapback at point "2" and then failure at point "3". At point #3 the voltage on x-axis for line "B" would be higher than the voltage on the x-axis for line "A". In other words, the voltage for line "B" will rise above point #1 just after point #2 and then point #3 would be at a much higher voltage than is the case for line "A". This leads to multi-finger triggering with a device having multiple fingers in parallel to form a wide device (i.e. 10 fingers, 20 um each finger, total width 200 um).

More specifically, point 1 is representative of Vt1, in which the transistor turns ON, point 2 is representative of Vh which is when voltage of the transistor (NPN) will snap back to a lower voltage and point 3 is representative of Vt2 which is a failure of the circuit. By increasing resistance with the lateral ballasting resistance using the techniques discussed with regard to FIGS. 1A-2D, it is possible to increase Vt2, which, in turn, allows subsequent fingers (e.g., ESD devices) in a multi-finger application to turn ON. This effectively allows all of the fingers (NPN) in the multi-finger device to turn ON and, hence, increases ESD performance.

By way of further example, it is understood that Vt may be slightly different for different devices due to process variations. Also, assume that a NPN will trigger at 6 V to 7 V and the snap back is about 2 V. In this example, without the additional ballast resistance provided by the arrangements of the present disclosure, once snap back occurs on the first transistor (NPN) and voltage drops to about 5 V, subsequent transistors in a multi-finger device will be prevented from triggering (e.g., turning ON). However, by adding the lateral ballasting resistance using the structures discussed above for FIGS. 1E and 2D, the triggering voltage to turn ON can be increased allowing subsequent devices in the multi-finger device to turn ON even with the snap back phenomenon. Hence, the lateral ballasting resistance formed in the fin-based bipolar structures of FIG. 1E and the FDSOI structure of FIG. 2D improves the ESD performance in FinFET technologies. In summary with regard to FIG. 3, Ron increases after initial triggering of one or more transistors in a multi-finger device to enable multi-finger triggering of all of the transistors of the multi-finger device.

From TCAD simulations, it has been determined that the above-described arrangements using FDSOI technology can increase Ron up to approximately 3×. Similarly, in the fin-ballast NPN arrangement Ron increased up to approximately 3.5×. The net result is that both the above-described FDSOI and fin-ballast devices show Ron increased in a 3-3.5× range, making these two devices capable of handling current finger to finger (good width scaling), whereas basic lateral NPN structures will not scale finger to finger. As an example, in a device with 10 fingers, the ballasted devices using the above-described arrangements can handle approximately 10× more current than basic lateral NPN devices, converting from non-working to working devices for ESD protection.

The ESD devices can be utilized in system on chip (SoC) technology. It should be understood by those of skill in the art that SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also commonly used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
   a collector fin structure of a first dopant type;
   an emitter fin structure of the first dopant type;
   a base fin structure of a second dopant type; and
   lateral ballasting fin structures of the first dopant type adjacent to the collector fin structure.

2. The structure of claim 1, wherein the lateral ballasting fin structures comprise semiconductor material adjacent to the collector fin structure.

3. The structure of claim 1, wherein the lateral ballasting fin structures include an epitaxial semiconductor material connecting a surface of the collector fin structure and surfaces of the ballasting resistance fins structures.

4. The structure of claim 2, wherein the collector fin structure, the emitter fin structure and the base fin structure are in a first well of the second dopant type, the ballasting resistance fin structures are in a second well of the first dopant type, and the second well is adjacent to and contacting the first well of the second dopant type.

5. The structure of claim 4, wherein the second well of the first dopant type comprises an N-well and the first well of the second dopant type comprises a P-well.

6. The structure of claim 1, further comprising shallow trench isolation regions which separate the emitter fin structure from the collector fin structure and the emitter fin structure from the base fin structure.

7. The structure of claim 6, wherein a width of one of the shallow trench isolation regions separating the emitter fin structure from the collector fin structure is greater than a distance between the collector fin structure and an adjacent ballast resistance fin structure.

8. The structure of claim 1, wherein the collector fin structure, the emitter fin structure and the base fin structure comprise bulk semiconductor substrate, and the semiconductor material of the lateral ballast resistance fin structures comprise a semiconductor on insulator (SOI) adjacent to the collector fin structure.

9. The structure of claim 8, wherein the semiconductor material of the SOI comprises one of: partially-depleted SOI and fully-depleted SOI, and wherein the semiconductor material contacts a side surface of the collector region.

10. The structure of claim 1, wherein the collector fin structure is shorted to the lateral ballasting fin structures.

11. The structure of claim 10, wherein the collector fin structure is shorted to the lateral ballasting fin structures with an epitaxial semiconductor layer.

12. A structure comprising:
a bipolar transistor comprising a collector region, an emitter region and a base region; and
shallow trench isolation regions which separate the emitter region from the collector region and the emitter region from the base region, wherein a width of one of the shallow trench isolation regions separating the emitter region from the collector region is greater than a distance between a collector fin structure and an adjacent ballast resistance fin.

13. The structure of claim 12, wherein the collector region comprises a collector fin structure, emitter region comprises an emitter fin structure, the base region comprises a base fin structure and the adjacent ballast resistance fin comprises plural fin structures.

14. The structure of claim 13, wherein the collector fin structure and the ballasting resistance fin structures comprise a same dopant type.

15. The structure of claim 12, further comprising epitaxial semiconductor material connecting the collector fin structure to the ballasting resistance fins structures.

16. The structure of claim 12, further comprising shallow trench isolation structures separating a base region from an emitter region and separating a collector region from the emitter region.

17. The structure of claim 16, further comprising an epitaxial semiconductor layer extending over each of the ballasting resistance fin structures, the collector fin structure, a first shallow trench isolation region and a second shallow trench isolation region, wherein the collector fin structure contacts a first well and is separated from an adjacent one of the ballasting resistance fin structures by the second shallow trench isolation region.

18. A structure comprising:
a collector fin structure;
an emitter fin structure;
a base fin structure;
lateral ballasting fin structures adjacent to the collector fin structure; and
shallow trench isolation regions which separate the emitter fin structure from the collector fin structure and the emitter fin structure from the base fin structure, wherein a width of one of the shallow trench isolation regions separating the emitter fin structure from the collector fin structure is greater than a distance between the collector fin structure and an adjacent ballast resistance fin structure.

* * * * *